United States Patent
Gibson et al.

(10) Patent No.: US 6,895,019 B2
(45) Date of Patent: *May 17, 2005

(54) SYSTEM FOR RECOVERING LOST INFORMATION IN A DATA STREAM BY MEANS OF PARITY PACKETS

(75) Inventors: William A. Gibson, Lafayette, CO (US); George E. Noble, Boulder, CO (US); Chris J. Stearns, Arvada, CO (US)

(73) Assignee: Niwot Networks, Inc., Longmont, CO (US)

( * ) Notice: Subject to any disclaimer, the term of this patent is extended or adjusted under 35 U.S.C. 154(b) by 249 days.

This patent is subject to a terminal disclaimer.

(21) Appl. No.: 10/215,527

(22) Filed: Aug. 9, 2002

(65) Prior Publication Data

US 2003/0002502 A1 Jan. 2, 2003

Related U.S. Application Data

(63) Continuation of application No. 09/071,103, filed on May 1, 1998, now Pat. No. 6,445,717.

(51) Int. Cl.[7] ............................ H04J 3/24; H03M 13/00
(52) U.S. Cl. ........................ 370/473; 709/236; 714/48; 714/746; 714/749; 714/752; 714/774; 714/776; 714/800
(58) Field of Search ................................. 370/464, 465, 370/468, 473, 474, 476, 912; 709/230, 236; 714/48, 1, 701, 746, 747, 748, 749, 751, 752, 761, 762, 774, 776, 779, 799, 800

(56) References Cited

U.S. PATENT DOCUMENTS

| | | | |
|---|---|---|---|
| 4,344,171 A | * | 8/1982 | Lin et al. ................... 714/751 |
| 4,375,581 A | | 3/1983 | Jayant |
| 4,494,233 A | | 1/1985 | Bahr et al. |
| 4,962,498 A | | 10/1990 | May, Jr. |
| 5,432,787 A | | 7/1995 | Chethik |
| 5,504,858 A | * | 4/1996 | Ellis et al. ...................... 714/6 |
| 5,553,067 A | | 9/1996 | Walker et al. |
| 5,790,524 A | | 8/1998 | Bennett et al. |
| 5,870,412 A | | 2/1999 | Schuster et al. |
| 5,896,493 A | * | 4/1999 | Rao .............................. 714/6 |
| 5,928,330 A | * | 7/1999 | Goetz et al. ................ 709/231 |
| 5,993,056 A | * | 11/1999 | Vaman et al. ............... 714/776 |
| 6,000,053 A | * | 12/1999 | Levine et al. ............... 714/766 |
| 6,078,785 A | * | 6/2000 | Bush ............................. 455/7 |
| 6,079,042 A | * | 6/2000 | Vaman et al. ............... 714/755 |
| 6,118,790 A | * | 9/2000 | Bolosky et al. ............. 370/468 |
| 6,141,784 A | * | 10/2000 | Davis et al. ................ 714/748 |
| 6,145,109 A | * | 11/2000 | Schuster et al. ............ 714/752 |
| 6,226,769 B1 | * | 5/2001 | Schuster et al. ............ 714/752 |
| 6,243,846 B1 | * | 6/2001 | Schuster et al. ............ 714/776 |
| 6,289,003 B1 | * | 9/2001 | Raitola et al. .............. 370/278 |
| 6,301,222 B1 | * | 10/2001 | Kovacevic et al. ......... 370/216 |
| 6,308,294 B1 | * | 10/2001 | Ghosh et al. ............... 714/751 |
| 6,317,418 B1 | * | 11/2001 | Raitola et al. .............. 370/278 |

* cited by examiner

Primary Examiner—Hassan Kizou
Assistant Examiner—Ahmed Elallam
(74) Attorney, Agent, or Firm—Duft Bornsen & Fishman; Daniel Fishman

(57) ABSTRACT

Data which is transmitted over the internet or other transmission networks is first divided up into individual information packets, transmitted and then reassembled into useful data after reception. Parity packets are included in with the information packets in the transmission of data in order to enable the regeneration of any information packets which were lost or damaged during transmission. The grouping of information packets and parity packets derived therefrom is termed a chunk. Chunk arrangements to recover from all cases of single and double lost packets are disclosed. Bursts of lost packets are recovered by interleaving the transmission of packets from different chunks. If the recovery is not successful then retransmission occurs in a manner similar to TCP.

6 Claims, 18 Drawing Sheets

106
Chunk 1 Information Packet 0
Chunk 1 Information Packet 1
Chunk 1 Information Packet 2
Chunk 1 Information Packet 3
Chunk 1 Information Packet 4
Chunk 1 Information Packet 5
Chunk 1 Information Packet 6
Chunk 1 Information Packet 7
Chunk 1 Information Packet 8
Chunk 1 Information Packet 9
Chunk 1 Information Packet 10
Chunk 1 Parity Packet 11 on packets 0-10

108
Chunk 2 Information Packet 0
Chunk 2 Information Packet 1
Chunk 2 Information Packet 2
Chunk 2 Information Packet 3
Chunk 2 Information Packet 4
Chunk 2 Information Packet 5
Chunk 2 Information Packet 6
Chunk 2 Information Packet 7
Chunk 2 Information Packet 8
Chunk 2 Information Packet 9
Chunk 2 Information Packet 10
Chunk 2 Parity Packet 11 on packets 0-10

110
Chunk 1 Information Packet 0
Chunk 2 Information Packet 0
Chunk 1 Information Packet 1
Chunk 2 Information Packet 1
Chunk 1 Information Packet 2
Chunk 2 Information Packet 2
Chunk 1 Information Packet 3
Chunk 2 Information Packet 3
Chunk 1 Information Packet 4
Chunk 2 Information Packet 4
Chunk 1 Information Packet 5
Chunk 2 Information Packet 5
Chunk 1 Information Packet 6
Chunk 2 Information Packet 6
Chunk 1 Information Packet 7
Chunk 2 Information Packet 7
Chunk 1 Information Packet 8
Chunk 2 Information Packet 8
Chunk 1 Information Packet 9
Chunk 2 Information Packet 9
Chunk 1 Information Packet 10
Chunk 2 Information Packet 10
Chunk 1 Parity Packet 11 on packets 0-10
Chunk 2 Parity Packet 11 on packets 0-10

*FIG. 5*

DATA STREAM TO SEND, 15 BYTES:
01 02 03 04 05 06 07 08 09 0A 0B 0C 0D 0E 0F

*FIG. 6A*

| DATA STREAM DIVIDED AMONG THE 4 INFORMATION PACKETS, PADDED WITH ONE ZERO BYTE | | | | |
|---|---|---|---|---|
| INFORMATION PACKET 0 PAYLOAD: 05 06 07 08 | 00000001 | 00000010 | 00000011 | 00000100 |
| INFORMATION PACKET 1 PAYLOAD: 05 06 07 08 | 00000101 | 00000110 | 00000111 | 00001000 |
| INFORMATION PACKET 2 PAYLOAD: 09 0A 0B 0C | 00001001 | 00001010 | 00001011 | 00001100 |
| INFORMATION PACKET 3 PAYLOAD: 0D 0E 0F 00 | 00001101 | 00001110 | 00001111 | 00000000 |

*FIG. 6B*

| PARITY PACKET 4 PAYLOAD IS XOR OF INFORMATION PACKET 0, 1, 2 PAYLOADS | | | | |
|---|---|---|---|---|
| INFORMATION PACKET 0 IN BINARY | 00000001 | 00000010 | 00000011 | 00000100 |
| INFORMATION PACKET 1 IN BINARY | 00000101 | 00000110 | 00000111 | 00001000 |
| INFORMATION PACKET 2 IN BINARY | 00001001 | 00001010 | 00001011 | 00001100 |
| XOR TO GET PARITY PACKET 4 IN BINARY | 00001101 | 00001110 | 00001111 | 00000000 |
| PARITY PACKET 4 PAYLOAD: 0D 0E 0F 00 | | | | |

*FIG. 6C*

| PARITY PACKET 5 PAYLOAD IS XOR OF INFORMATION PACKET 0, 1, 3 PAYLOADS | | | | |
|---|---|---|---|---|
| INFORMATION PACKET 0 IN BINARY | 00000001 | 00000010 | 00000011 | 00000100 |
| INFORMATION PACKET 1 IN BINARY | 00000101 | 00000110 | 00000111 | 00001000 |
| INFORMATION PACKET 3 IN BINARY | 00001101 | 00001110 | 00001111 | 00000000 |
| XOR TO GET PARITY PACKET 5 IN BINARY | 00001001 | 00001010 | 00001011 | 00001100 |
| PARITY PACKET 5 PAYLOAD: 09 0A 0B 0C | | | | |

*FIG. 6D*

| PARITY PACKET 6 PAYLOAD IS XOR OF INFORMATION PACKET 0, 2, 3 PAYLOADS | | | | |
|---|---|---|---|---|
| INFORMATION PACKET 0 IN BINARY | 00000001 | 00000010 | 00000011 | 00000100 |
| INFORMATION PACKET 2 IN BINARY | 00001001 | 00001010 | 00001011 | 00001100 |
| INFORMATION PACKET 3 IN BINARY | 00001101 | 00001110 | 00001111 | 00000000 |
| XOR TO GET PARITY PACKET 6 IN BINARY | 00000101 | 00000110 | 00000111 | 00001000 |
| PARITY PACKET 6 PAYLOAD: 05 06 07 08 | | | | |

*FIG. 6E*

CONTENTS OF INFORMATION PACKET 0 MAY BE RECONSTRUCTED IF ENOUGH PACKET PAYLOADS ARE KNOWN TO SOLVE ONE OF THESE FOUR EQUATIONS:
    1. INFORMATION PACKET 0 PAYLOAO = XOR OF PAYLOADS OF PACKETS 1, 2 AND 4
    2. INFORMATION PACKET 0 PAYLOAD = XOR OF PAYLOADS OF PACKETS 1, 3 AND 6
    3. INFORMATION PACKET 0 PAYLOAO = XOR OF PAYLOADS OF PACKETS 2, 3 AND 6
    4. INFORMATION PACKET 0 PAYLOAD = XOR OF PAYLOADS OF PACKETS 4, 5 AND 6

*FIG. 7A*

CONTENTS OF INFORMATION PACKET 1 MAY BE RECONSTRUCTED IF ENOUGH PACKET PAYLOADS ARE KNOWN TO SOLVE ONE OF THESE TWO EQUATIONS:
    1. INFORMATION PACKET 1 PAYLOAD = XOR OF PAYLOADS OF PACKETS 0, 2 AND 4
    2. INFORMATION PACKET 1 PAYLOAD = XOR OF PAYLOADS OF PACKETS 0, 3 AND 5

*FIG. 7B*

CONTENTS OF INFORMATION PACKET 2 MAY BE RECONSTRUCTED IF ENOUGH PACKET PAYLOADS ARE KNOWN TO SOLVE ONE OF THESE TWO EQUATIONS:
    1. INFORMATION PACKET 2 PAYLOAD = XOR OF PAYLOADS OF PACKETS 0, 1 AND 4
    2. INFORMATION PACKET 2 PAYLOAD = XOR OF PAYLOADS OF PACKETS 0, 3 AND 6

*FIG. 7C*

CONTENTS OF INFORMATION PACKET 3 MAY BE RECONSTRUCTED IF ENOUGH PACKET PAYLOADS ARE KNOWN TO SOLVE ONE OF THESE TWO EQUATIONS:
    1. INFORMATION PACKET 3 PAYLOAD = XOR OF PAYLOADS OF PACKETS 0, 1 AND 5
    2. INFORMATION PACKET 3 PAYLOAD = XOR OF PAYLOADS OF PACKETS 0, 2 AND 6

*FIG. 7D*

THE PARITY TRUTHS TABLE FOR redtype=131 (Send 7 to get 4), IN BINARY:

| PAYLOAD OF PACKET: | | | IS EQUAL TO THE XOR OF PACKETS: | | |
|---|---|---|---|---|---|
| 3 | 2 | 1 | 3 | 2 | 1 |
| 10987654321 | 0987654321 | 09876543210 | 10987654321 | 0987654321 | 09876543210 |
| 00000000000 | 0000000000 | 00000000001 | 00000000000 | 0000000000 | 00000010110 |
| 00000000000 | 0000000000 | 00000000001 | 00000000000 | 0000000000 | 00000101010 |
| 00000000000 | 0000000000 | 00000000001 | 00000000000 | 0000000000 | 00001001100 |
| 00000000000 | 0000000000 | 00000000001 | 00000000000 | 0000000000 | 00001110000 |
| 00000000000 | 0000000000 | 00000000010 | 00000000000 | 0000000000 | 00000010101 |
| 00000000000 | 0000000000 | 00000000010 | 00000000000 | 0000000000 | 00000101001 |
| 00000000000 | 0000000000 | 00000000100 | 00000000000 | 0000000000 | 00000010011 |
| 00000000000 | 0000000000 | 00000000100 | 00000000000 | 0000000000 | 00001001100 |
| 00000000000 | 0000000000 | 00000001000 | 00000000000 | 0000000000 | 00000100011 |
| 00000000000 | 0000000000 | 00000001000 | 00000000000 | 0000000000 | 00001000101 |
| 00000000000 | 0000000000 | 00000010000 | 00000000000 | 0000000000 | 00000000111 |
| 00000000000 | 0000000000 | 00000100000 | 00000000000 | 0000000000 | 00000001011 |
| 00000000000 | 0000000000 | 00001000000 | 00000000000 | 0000000000 | 00000001101 |

THE PARITY TRUTHS TABLE FOR redtype =131 (Send 7 to get 4), IN HEX:
PAYLOAD OF PACKET: IS EQUAL TO THE XOR OF PACKETS:

| | |
|---|---|
| 00000001 | 00000016 |
| 00000001 | 0000002A |
| 00000001 | 0000004C |
| 00000001 | 00000070 |
| 00000002 | 00000015 |
| 00000002 | 00000029 |
| 00000004 | 00000013 |
| 00000004 | 0000004C |
| 00000008 | 00000023 |
| 00000008 | 00000045 |
| 00000010 | 00000007 |
| 00000020 | 0000000B |
| 00000040 | 0000000D |

*FIG. 7E*

| INFORMATION PACKET 1 IN BINARY | 00000101 | 00000110 | 00000111 | 00001000 |
|---|---|---|---|---|
| INFORMATION PACKET 3 IN BINARY | 00001101 | 00001110 | 00001111 | 00000000 |
| PARITY PACKET 4 IN BINARY | 00001101 | 00001110 | 00001111 | 00000000 |
| PARITY PACKET 5 IN BINARY | 00001001 | 00001010 | 00001011 | 00001100 |

*FIG. 9A*

| INFORMATION PACKET 1 IN BINARY | 00000101 | 00000110 | 00000111 | 00001000 |
|---|---|---|---|---|
| INFORMATION PACKET 3 IN BINARY | 00001101 | 00001110 | 00001111 | 00000000 |
| PARITY PACKET 5 IN BINARY | 00001001 | 00001010 | 00001011 | 00001100 |
| XOR 1, 3, 5 TOGETHER TO GET 0: INFORMATION PACKET 0 IN BINARY | 00000001 | 00000010 | 00000011 | 00000100 |
| MARK 0 AS PRESENT |||||

*FIG. 9B*

| INFORMATION PACKET 0 IN BINARY | 00000001 | 00000010 | 00000011 | 00000100 |
|---|---|---|---|---|
| INFORMATION PACKET 1 IN BINARY | 00000101 | 00000110 | 00000111 | 00001000 |
| PARITY PACKET 4 IN BINARY | 00001101 | 00001110 | 00000111 | 00000000 |
| XOR 0, 1, 4 TOGETHER TO GET 2: INFORMATION PACKET 2 IN BINARY | 00001001 | 00001010 | 00001011 | 00001100 |
| MARK 2 AS PRESENT |||||

*FIG. 9C*

| LOST | RECONSTRUCTION ACTIONS |
|---|---|
| 0, 1 | 0 RECONSTRUCTED FROM 2, 3 AND 6, ITERATE<br>1 RECONSTRUCTED FROM 0, 2 AND 4 |
| 0, 2 | 0 RECONSTRUCTED FROM 1, 3 AND 5, ITERATE<br>2 RECONSTRUCTED FROM 0, 1 AND 4 |
| 0, 3 | 0 RECONSTRUCTED FROM 1, 2 AND 4, ITERATE<br>3 RECONSTRUCTED FROM 0, 1 AND 5 |
| 0, 4 | 0 RECONSTRUCTED FROM 1, 3 AND 5 |
| 0, 5 | 0 RECONSTRUCTED FROM 1, 2 AND 4 |
| 0, 6 | 0 RECONSTRUCTED FROM 1, 2 AND 4 |
| 1, 2 | 1 RECONSTRUCTED FROM 0, 3 AND 5, ITERATE<br>2 RECONSTRUCTED FROM 0, 1 AND 4 |
| 1, 3 | 1 RECONSTRUCTED FROM 0, 2 AND 4, ITERATE<br>3 RECONSTRUCTED FROM 0, 1 AND 5 |
| 1, 4 | 1 RECONSTRUCTED FROM 0, 3 AND 5 |
| 1, 5 | 1 RECONSTRUCTED FROM 0, 2 AND 4 |
| 1, 6 | 1 RECONSTRUCTED FROM 0, 2 AND 4 |
| 2, 3 | 2 RECONSTRUCTED FROM 0, 1 AND 4, ITERATE<br>3 RECONSTRUCTED FROM 0, 1 AND 5 |
| 2, 4 | 2 RECONSTRUCTED FROM 0, 3 AND 6 |
| 2, 5 | 2 RECONSTRUCTED FROM 0, 1 AND 4 |
| 2, 6 | 2 RECONSTRUCTED FROM 0, 1 AND 4 |
| 3, 4 | 3 RECONSTRUCTED FROM 0, 1 AND 5 |
| 3, 5 | 3 RECONSTRUCTED FROM 0, 2 AND 6 |
| 3, 6 | 3 RECONSTRUCTED FROM 0, 1 AND 5 |
| 4, 5 | NO RECONSTRUCTION NEEDED |
| 4, 6 | NO RECONSTRUCTION NEEDED |
| 5, 6 | NO RECONSTRUCTION NEEDED |

*FIG. 10*

| LOST | RECONSTRUCTION ACTIONS |
|---|---|
| 0, 1, 2 | 0 RECONSTRUCTED FROM 4, 3, 6, ITERATE<br>1 RECONSTRUCTED FROM 0, 2, 4 |
| 0, 1, 3 | 0 RECONSTRUCTED FROM 4, 5, 6, ITERATE<br>1 RECONSTRUCTED FROM 0, 2, 4 |
| 0, 1, 4 | 0 RECONSTRUCTED FROM 2, 3, 6, ITERATE<br>1 RECONSTRUCTED FROM 0, 3, 5 |
| 0, 1, 5 | 0 RECONSTRUCTED FROM 2, 3, 6, ITERATE<br>1 RECONSTRUCTED FROM 0, 2, 4 |
| 0, 1, 6 | FAILS |
| 0, 2, 3 | 0 RECONSTRUCTED FROM 4, 5, 6, ITERATE<br>2 RECONSTRUCTED FROM 0, 1, 4 |
| 0, 2, 4 | 0 RECONSTRUCTED FROM 1, 3 AND 5, ITERATE<br>2 RECONSTRUCTED FROM 0, 3 AND 6 |
| 0, 2, 5 | FAILS |
| 0, 2, 6 | 0 RECONSTRUCTED FROM 1, 3 AND 5, ITERATE<br>2 RECONSTRUCTED FROM 0, 1 AND 4 |
| 0, 3, 4 | FAILS |
| 0, 3, 5 | 0 RECONSTRUCTED FROM 1, 2 AND 4, ITERATE<br>3 RECONSTRUCTED FROM 0, 2 AND 6 |
| 0, 3, 6 | 0 RECONSTRUCTED FROM 1, 2 AND 4, ITERATE<br>3 RECONSTRUCTED FROM 0, 1 AND 4 |
| 0, 4, 5 | 0 RECONSTRUCTED FROM 2, 3 AND 6 |
| 0, 4, 6 | 0 RECONSTRUCTED FROM 1, 3 AND 5 |
| 0, 5, 6 | 0 RECONSTRUCTED FROM 1, 2 AND 4 |
| 1, 2, 3 | FAILS |
| 1, 2, 4 | 1 RECONSTRUCTED FROM 0, 3 AND 5, ITERATE<br>2 RECONSTRUCTED FROM 0, 3 AND 6 |
| 1, 2, 5 | 2 RECONSTRUCTED FROM 0, 3 AND 6, ITERATE<br>1 RECONSTRUCTED FROM 0, 2 AND 4 |
| 1, 2, 6 | 1 RECONSTRUCTED FROM 0, 3 AND 5, ITERATE<br>2 RECONSTRUCTED FROM 0, 1 AND 4 |
| 1, 3, 4 | 3 RECONSTRUCTED FROM 0, 2 AND 6, ITERATE<br>1 RECONSTRUCTED FROM 0, 3 AND 5 |

*FIG. 11A*

| | |
|---|---|
| 1, 3, 5 | 1 RECONSTRUCTED FROM 0, 2 AND 4, ITERATE<br>3 RECONSTRUCTED FROM 0, 2 AND 6 |
| 1, 3, 6 | 1 RECONSTRUCTED FROM 0, 2 AND 4, ITERATE<br>3 RECONSTRUCTED FROM 0, 1 AND 5 |
| 1, 4, 5 | FAILS |
| 1, 4, 6 | 1 RECONSTRUCTED FROM 0, 3 AND 5 |
| 1, 5, 6 | 1 RECONSTRUCTED FROM 0, 2 AND 4 |
| 2, 3, 4 | 3 RECONSTRUCTED FROM 0, 1 AND 5, ITERATE<br>2 RECONSTRUCTED FROM 0, 3 AND 6 |
| 2, 3, 5 | 2 RECONSTRUCTED FROM 0, 1 AND 4, ITERATE<br>3 RECONSTRUCTED FROM 0, 2 AND 6 |
| 2, 3, 6 | 3 RECONSTRUCTED FROM 0, 1 AND 5, ITERATE<br>2 RECONSTRUCTED FROM 0, 1 AND 4 |
| 2, 4, 5 | 2 RECONSTRUCTED FROM 0, 3 AND 6 |
| 2, 4, 6 | FAILS |
| 2, 5, 6 | 2 RECONSTRUCTED FROM 0, 1 AND 4 |
| 3, 4, 5 | 3 RECONSTRUCTED FROM 0, 2 AND 6 |
| 3, 4, 6 | 3 RECONSTRUCTED FROM 0, 1 AND 5 |
| 3, 5, 6 | FAILS |
| 4, 5, 6 | NO RECONSTRUCTION NEEDED |

*FIG. 11B*

SYSTEM FOR RECOVERING LOST INFORMATION IN A DATA STREAM BY MEANS OF PARITY PACKETS

This patent is a continuation of patent application Ser. No. 09/071,103, filed May 1, 1998 and now issued on Sep. 3, 2002 as U.S. Pat. No. 6,445,717.

FIELD OF THE INVENTION

This invention relates to a method and apparatus for transmitting a data stream, (e.g., voice, video and/or data) through a Data Transmission Network and more particularly to the generation and transmission of additional parity packets and the use of the additional parity packets to reconstruct one or more information packets which are lost between transmission and reception.

BACKGROUND OF THE INVENTION

In Data Transmission Networks, such as the Internet, information to be transmitted is often divided into segments. The information in each segment is combined with a header which includes source and destination addressing as well as control information. This combination of information is termed a "packet." A packet is transmitted through the Internet or any type of Data Transmission Network and is either received at its destination or it is lost along the way. Some causes of packet loss include transmission line errors, collisions between packets, traffic overload at a packet store-and-forward node, traffic overload at a router, or buffer overload at the sending or receiving station. Delayed forwarding of packets may cause a packet to appear so late that it is regarded as lost.

A number of approaches have been developed in order to recover the lost information. In the Internet context, one approach is the Transmission Control Protocol (TCP) for communications between hosts in packet switched Internet protocol networks. TCP recovers data that is damaged, lost, or duplicated or delivered out of order by assigning a sequence number to each OCTET(or Byte) and requiring a positive acknowledgment from the receiving side. If the acknowledgment is not received within a time out interval, the data is retransmitted. At the receiver, the sequence numbers are used to correctly order segments that may be received out of order and to eliminate duplicates. Damage of a packet is handled by adding a check sum to each segment transmitted, checking at the receiver, and discarding damaged segments.

The User Datagram Protocol (UDP) was created to provided a datagram mode of communication between hosts in packet switched Internet protocol networks. Damage is handled by adding a check sum to each segment transmitted, checking at the receiver, and discarding damaged segments. UDP is transaction oriented, and delivery and duplicate protection are not guaranteed. The User Datagram Protocol (UDP) is therefore not a suitable host-to-host protocol for certain applications, but it is possible to build a reliable host-to-host protocol on UDP.

The above described recovery systems do have drawbacks. With TCP, packet loss requires retransmission for recovery. In an Internet protocol network, packets may be lost due to congestion at any of multiple places in their journey from source to destination. When a transmission is restarted, it is restarted at the first segment which has not been acknowledged. This means that not only is the lost packet retransmitted, but all packets following the lost packet are also retransmitted. A significant portion of Internet traffic (the Internet being the largest example of an Internet protocol network), is made up of packets being retransmitted. The efficiency of systems which transmit information over the Internet is significantly impaired by the retransmission of these packets. Moreover, for certain streaming applications such as various audio and video transmissions where stream continuity is an important consideration, such retransmission based recovery systems are unreliable and can substantially impair transmission fidelity.

SUMMARY OF THE INVENTION

The invention described herein includes a method and apparatus for transmitting information in a data network from a first node to a second node. At the first (transmitting) node, the information to be transmitted is divided up into a plurality of information packets. Based on the information contained within some or all of the information packets, at least one parity packet (sometimes referred to below as a redundant packet) is generated and is included with the transmission of the information packets. When the packets reach the second (receiving) node, a check is made as to whether any of the packets have been damaged or lost. If either of these things has occurred, the parity packets are used in conjunction with the remaining transmission packets to reconstruct the packets which had been either lost or damaged. If reconstruction is not successful then retransmission occurs in a manner similar to TCP.

The present invention entails systems and processes for generating parity packets, for transmitting information packets and parity packets (collectively, "transmission packets") within a network, and for using the parity packets to recover lost or damaged packets (sometimes herein collectively referred to as "lost packets"). In this regard, the invention may be embodied in: logic resident on a transmitting node for inter alia packetizing a data stream, generating parity packets and transmitting the transmission packets; and logic resident on a receiving node for inter alia receiving the transmission packets, identifying lost packets, using the parity packets to regenerate the lost packets, and recreating a data stream from the information packets. In addition, the receiving node contains logic to send acknowledgements and the sending node contains logic to retransmit packets based on acknowledgements received or based on non-receipt of acknowledgements. In addition, the invention may include a network structure, such as an FTP, WEB or Gigabyte Express server, for downloading transmitter/receiver logic and/or conveying transmission packet streams including parity packets between network nodes.

The parity packets are generated as a function of the data in the information packets. In one implementation, each bit in the payload portion of the parity packets is determined as a function of the corresponding bits in at least two information packets. In one aspect of the invention, the parity packet may be generated by an exclusive OR (XOR) operation performed on the information packets. In the event that a packet is lost during transmission, an XOR can be performed between the parity packet and the remaining packets to regenerate the lost packet. It will thus be appreciated that the parity packets, sometimes referred to herein as redundant packets, are not generally duplicate packets. It will be appreciated that duplicate packets could be sent and used to replace lost packets, thereby satisfying the objective of avoiding retransmission. However, the various parity packet systems described below reduce the total amount of extra packets that must be sent, i.e., transmission overhead.

Numerous parity packet implementations are possible. In one implementation, one parity packet is transmitted with N information packets in order to recover one lost information packet (N+1: N parity). In another implementation, N parity packets are transmitted with ($2^N$–1)-N information packets, where N is greater than or equal to 3, in order to recover all cases of one or two lost information packets and in many cases up to N lost information packets ($2^N$–1: ($2^N$–1)-N). In any such case, the grouping of information packets and parity packets derived therefrom is termed a "chunk". The sending side may change the number of packets within a chunk, as well as the type of parity (or redundancy) for the chunk (including the option of no parity packets) in response to detecting retransmissions or other feedback on the progress of the data stream's transmission.

According to another aspect of the invention, M chunks can be further combined into a superchunk in which the information and parity packets of all the chunks are interleaved in such a fashion that minimizes the effect of a burst of packets being lost during transmission. When such interleaving is implemented with N+1: N parity, a block of M successive packets may be lost and successfully regenerated. When interleaving is used with $2^N$–1: ($2^N$–1)-N parity, a block of 2M successive packets may be lost and successfully regenerated. In this regard, the size of the superchunks (i.e., the number of chunks within a superchunk) can be selected to address the largest bursts of lost packets that are expected. For example, such burst events can be monitored to allow for dynamic superchunk reconfiguration, e.g., to tune the transmission structure (chunk size, superchunk size and/or parity type) based on current or historic network conditions.

Each of the packets transmitted may contain identifying information in a header. Included in the header may be information concerning: which chunk the packet is within, the payload length of the packet, the parity type (redtype), a unique identifier of the packet, and a unique identifier of the chunk. After the information packets are received and checked, this header information may be used in an acknowledgment which may be transmitted back to the transmitting node. The choice of the parity type, the choice of N (chunk size), and the choice of M (superchunk size) may be changed dynamically as noted above, or it may be changed manually based on empirical observations.

DESCRIPTION OF THE DRAWINGS

FIG. 5 discloses an example of a superchunk made from a 2 to 1 interleave of 2 chunks, each of which is a chunk of 12 packets with N+1:N parity.

FIGS. 6a, b, c, d, and e disclose the generation of parity packets in a 7,4 chunk.

FIGS. 7a, b, c, d, and e disclose the parity equations for a 7,4 chunk.

FIGS. 9a, b, and c disclose an example of recovered information packets in a 7,4 chunk.

FIG. 10 discloses all the possibilities for 2 lost packets in a 7,4 chunk, and the recovery of the lost packets.

FIGS. 11a and b disclose all the possibilities for 3 lost packets in a 7,4 chunk, and the recovery of lost packets.

DETAILED DESCRIPTION

Figure 1:
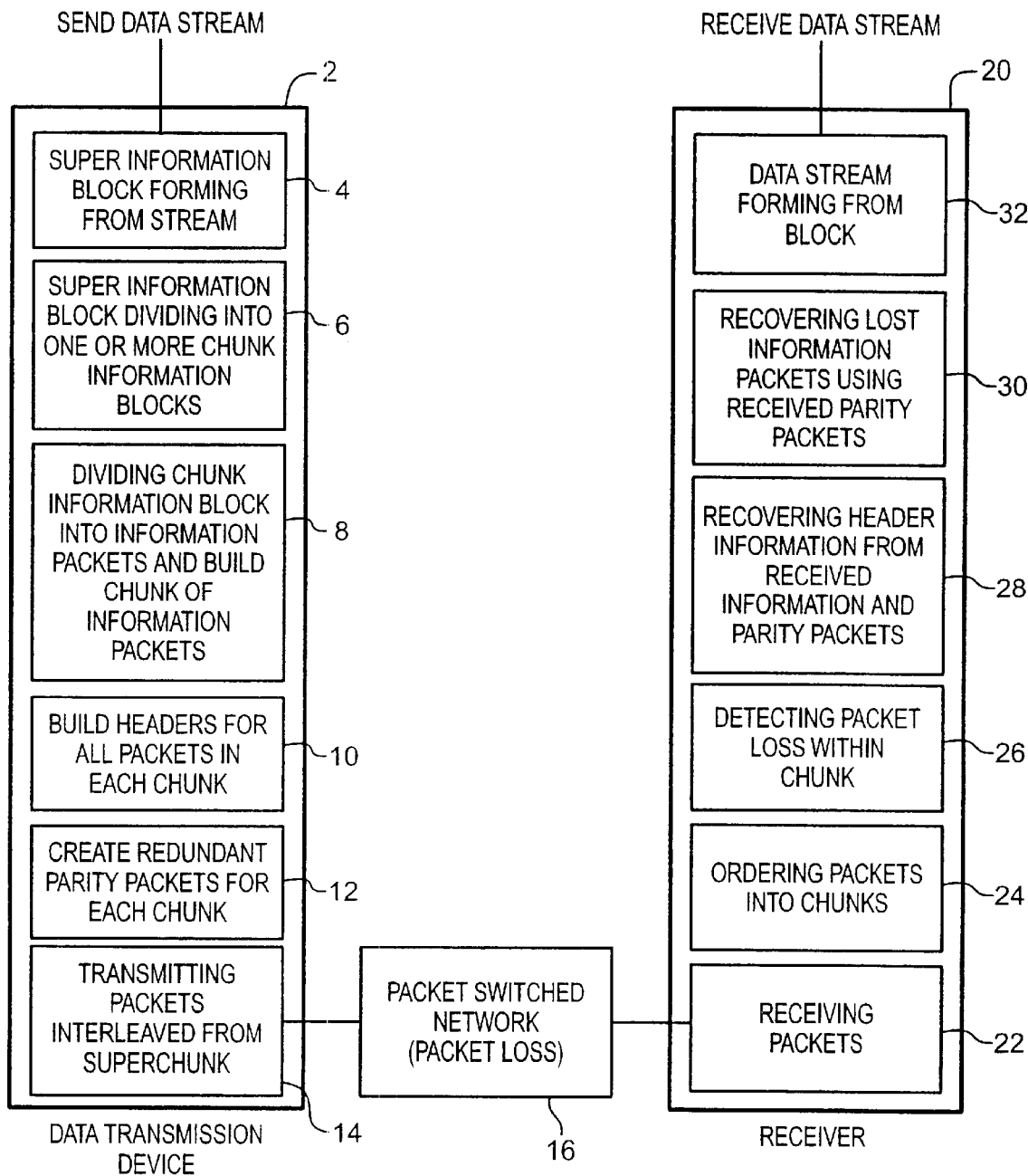
FIG. 1 is a system diagram which includes the transmitter, the packet switched network, and the receiver.

FIG. 1 discloses an exemplary system for transmitting data from a first node, through a packet switched Data Transmission Network, to a second node according to the present invention. Data transmission device 2 receives the information to be transmitted from an external data stream (e.g., an application program—usually via computer memory) and organizes it in a format to facilitate transmission. Transmission device 2, then, divides and organizes in preparation for transmission. Once the information has been organized in an appropriate manner, it is sent out over packet switched Data Transmission Network 16. In the preferred embodiment of the invention this Transmission Network is an internet type system, however, one skilled in the art would recognize that many types of data transmission networks can be used with the method described herein. The data transmitted over the network is received at data receiver 20. The data is then checked as to whether all information that was transmitted made it through the network. The receiver 20 also reorganizes the information into a desirable format and if there is detection of any lost or damaged data the receiver performs operations in order to recover such information. If the recovery is not successful then retransmission occurs in the usual (as if it were Transmission Control Protocol (TCP)) way. The receiver 20 delivers a Receive Data Stream which is identical to the original Send Data Stream to a receiving system such as an application program (usually via computer memory).

In a more detailed description of the system in FIG. 1, the transmitter first receives the data stream from an application program and forms the data into blocks called "Super Information Blocks" (4). The Super Information Blocks are divided (6) into one or more "Chunk Information Blocks". Each Chunk Information Block (8) is further divided into "Packet Information Blocks". Headers are pre-pended (10) to the Packet Information Blocks, and space is reserved (12) for "Packet Parity Blocks", and headers are prepended to the Packet Parity Blocks. The creation of these Packet Parity Blocks will be described in more detail in FIG. 4 below. After all the chunks (and packets within the chunks) of a superchunk have been formed, packets are sent to the switch network in an interleaved fashion. The packets are in the form of User Datagram Protocol (UDP) packets and the packet switch network in the illustrated embodiment is an internet protocol network.

After transmission of the superchunks over the network, the UDP packets are received (22) and the headers are examined to associate and order (24) the received packets with other received packets which came from the same chunk. This ordering has the additional effect of undoing the (possibly) interleaved fashion in which the original superchunk was transmitted. For this reason there is no further mention of superchunks in the receiver 20 disclosure. The chunks are then examined (26) to detect missing packets. The header information which applies to the entire chunk is saved (28) by the receiver 20. This information includes TCP and overhead information which is described in greater detail below. An attempt is made (30) to recover The Packet Information Block(s) which were originally included in lost or damaged information packets within the chunk. This information is recovered by using the combination of the Packet Information Blocks from information packets received and Packet Parity Blocks from parity packet(s) received associated with that chunk. Particular methods of accomplishing this recovery are described in FIGS. 5, 6, 7, 8, and 9 below. Once Chunk processing is completed successfully, the completed Chunk Information Block is included (32) into a received data stream which matches the content of the original data stream. Once receiver chunk processing is completed (whether the chunk was completely received or recovery was attempted), an acknowledgment is sent to the transmitter 2. This acknowledgment contains information used by the transmitter to decide (as in TCP) when and whether to re-transmit as well as containing other information similar to that provided in TCP and RFC1323. The acknowledgment may be in a single packet chunk or incorporated in the headers of a multi-packet chunk.

Figure 2:
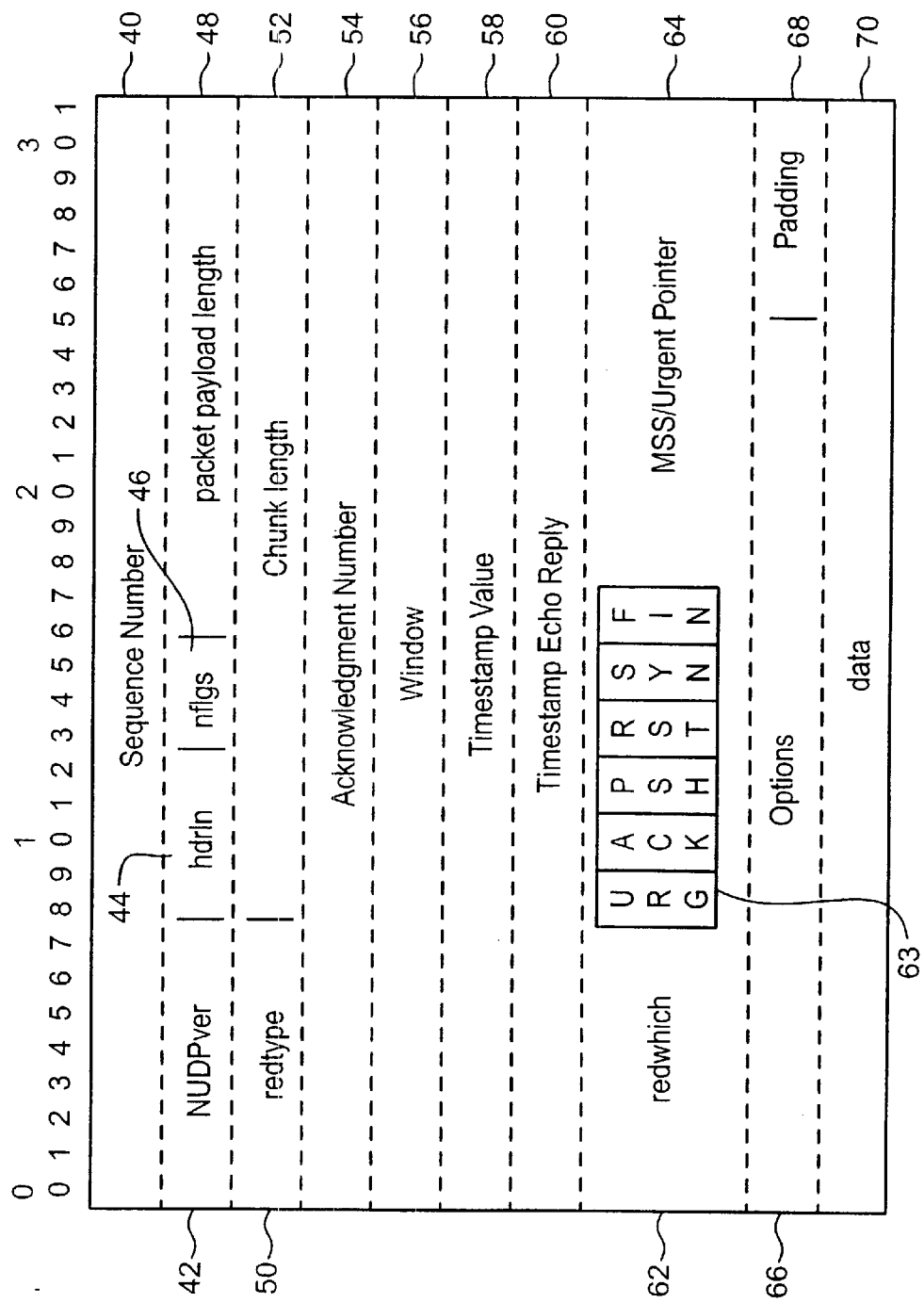
FIG. 2 discloses the configuration of the transmission packets.

The packets which are sent across the Transmission Network can take on many types of information and many different forms, FIG. 2 describes in detail the structure of the transmission packets in a preferred embodiment of the invention. One skilled in the art would know that the data in the transmission packets can be organized in a multitude of different ways and what is described below is merely one embodiment. This Figure shows the new transmission control protocol (NTCP) data block arrangement within a packet. In a preferred embodiment of the invention this NTCP data block is further encapsulated within the user data protocol (UDP) which is itself encapsulated within the internet protocol (IP) for transmission over an internet protocol network. The sequence number 40 is similar to that used in TCP and is the sequence number of the first payload byte within the chunk. The sequence number is the same for all the packets within the same chunk. Block 42, NUDPver has the value of 1 for the present version of the implementation. Future versions of the implementation which add functionality or overcome problems will need to exchange version information to interoperate, this field may be used for that exchange. The hdrlen 44, has a value of 8, but it may change in future versions. The hdrlen 44, similar to TCP header length, is the size of the header in 32-bit words, including options. The packet payload length 48 describes the size of the data portion 70 of the packet in bytes. This value is the same for all packets within the same chunk. In the preferred embodiment, this is an integer multiple of four and may contain values from 0 to 1432. The redtype 50 specifies the number of packets within a chunk, as well as the type of parity (or redundancy) for the chunk. In the preferred embodiment, all the packets within a superchunk have the same redtype. Some examples of redtypes supported in the preferred embodiment are:

| | |
|---|---|
| redtype equals 0, no parity | (This is used in solo acknowledgment packets) |
| redtype equals 66 (01 000010) | chunk size of 3 packets, including 2 information packets and 1 parity packet. Redundancy type $N + 1{:}N$, where $N = 2$. |
| redtype equals 75 (01 001011) | chunk size of 12 packets, including 11 information packets and 1 parity packet. Redundancy type $N + 1{:}N$, where $N = 11$. |
| redtype equals 131 (10 000011) | chunk size of 7 packets, including 4 information packets and 3 parity packets. Redundancy type $2^N - 1{:}2^N - 1 - N$ where $N = 3$. |
| redtype equals 132 (10 000100) | chunk size of 15 packets, including 11 information packets and 4 parity packets. Redundancy type $2^N - 1{:}2^N - 1 - N$ where $N = 4$. |
| redtype equals 133, (10 000101) | chunk size of 31 packets, including 26 information packets and 5 parity packets. Redundancy type $2^N - 1{:}2^N - 1 - N$ where $N = 5$. |

The sending side may change redtype in response to detecting retransmissions or other feedback on the progress of the data stream's transmission. In the preferred embodiment the node initiating the connection may select an initial redtype and interleave to be used as well as select "fixed" or "dynamic". When dynamic is selected the sender counts successfully sent and acknowledged chunks which contain data since the last retransmission or link start-up. When the count exceeds a defined value (for example 30) then the redundancy may be decreased. When a retransmission is required and the count is less than a defined value (for example 10) then the redundancy may be increased. The sending side may change redtype and interleave at a superchunk boundary. In one implementation, the redundancies used are (in increasing order):

redtype=75 (Send 12 to get 11), Interleave=1 (1 chunk per superchunk)

redtype=75 (Send 12 to get 11), Interleave=2 (2 chunks per superchunk)

redtype=133 (Send 31 to get 26), Interleave=1 (1 chunk per superchunk)

redtype=132 (Send 15 to get 11), Interleave=1 (1 chunk per superchunk)

redtype=132 (Send 15 to get 11), Interleave=2 (2 chunks per superchunk)

redtype=131 (Send 7 to get 4), Interleave=2 (2 chunks per superchunk)

redtype=131 (Send 7 to get 4), Interleave=3 (3 chunks per superchunk)

The current embodiment illustrates connection-by-connection selection of redundancy as well as an example of changing redundancy based on observing the progress of data stream transmission once a connection has been established. One skilled in the art would know that a multitude of redtype values may defined under this invention in addition to these illustrated, the parity or redundancy alternatives can be ordered in a multitude of different ways, that different combinations of redtype and Interleave are reasonable, and that what is described above is merely one embodiment.

Chunk length 52 is the number of data stream bytes contained in the chunk. The number of information packets in a chunk(specified in red type 50) times the packet payload length 48 is greater than or equal to the chunk length 52. If the product is greater, the excess is padded with zeros. The acknowledgment number 54 is valid if the ACK TCP flag 63 is a 1, and is the next sequence number which the receiver portion of the host expects to see in the next chunk it receives. The receipt of ACK packet means that sequence numbers "less than" acknowledgment number 54 have been correctly received. "Less than" is calculated mod ($2^{32}$) and the window size measured in bytes is never allowed to exceed $2^{30}-1$.

The window 56 is, as in TCP, an advertisement of available buffer size by the receiving portion of the host sending the packet. The window 56 in the preferred embodiment is the number of packets whose payload is MSS 64 or less which the receiver can accommodate starting with the chunk containing the acknowledgment number in its sequence number field. In a preferred embodiment the window is a 32 bit number. The window size measured in bytes is the value in this field multiplied by the MSS. The time stamp value 58 is local time on the host sending the chunk. The receiving station puts this value into time stamp echo reply 60 on the packet (or chunk) which it sends to acknowledge receipt of the chunk. The usage of the time stamp value and time stamp echo reply are defined in RFC 1323. In this way a round-trip time may be calculated. As in TCP, the allowed time for receipt of an acknowledgment is 1.3 to 2 times the averaged round trip time. In one implementation the allowed acknowledgment time is initially set to 6 seconds with a lower bound of 2 seconds and an upper bound of 60 seconds.

The redwhich 62 in combination with redtype identifies which packet of the chunk the packet is and whether it is a parity packet or an information packet. In a preferred embodiment all of the information packets within a chunk are transmitted before the parity packets within the chunk. The TCP flags 63 are as defined in TCP. The MSS/urgent pointer 64 is a MSS maximum segment size as defined in TCP whenever the URG flag in the TCP flags 63 is a zero. The MSS value in bytes is the NTCP max packet payload size which the receiver can accept. In the illustrated embodiment, when connecting to an internet with an Ethernet this value is 1472 bytes. The sending host is expected to adjust the packet send size so that the packet payload length 48 plus header length (hdrlen (44)*4) is less than or equal to the MSS requested by the receiver. If the URG flag 63 is one, then the field is defined as in TCP. The actual data which is transmitted via the packet is stored in the data portion 70.

Figure 3:
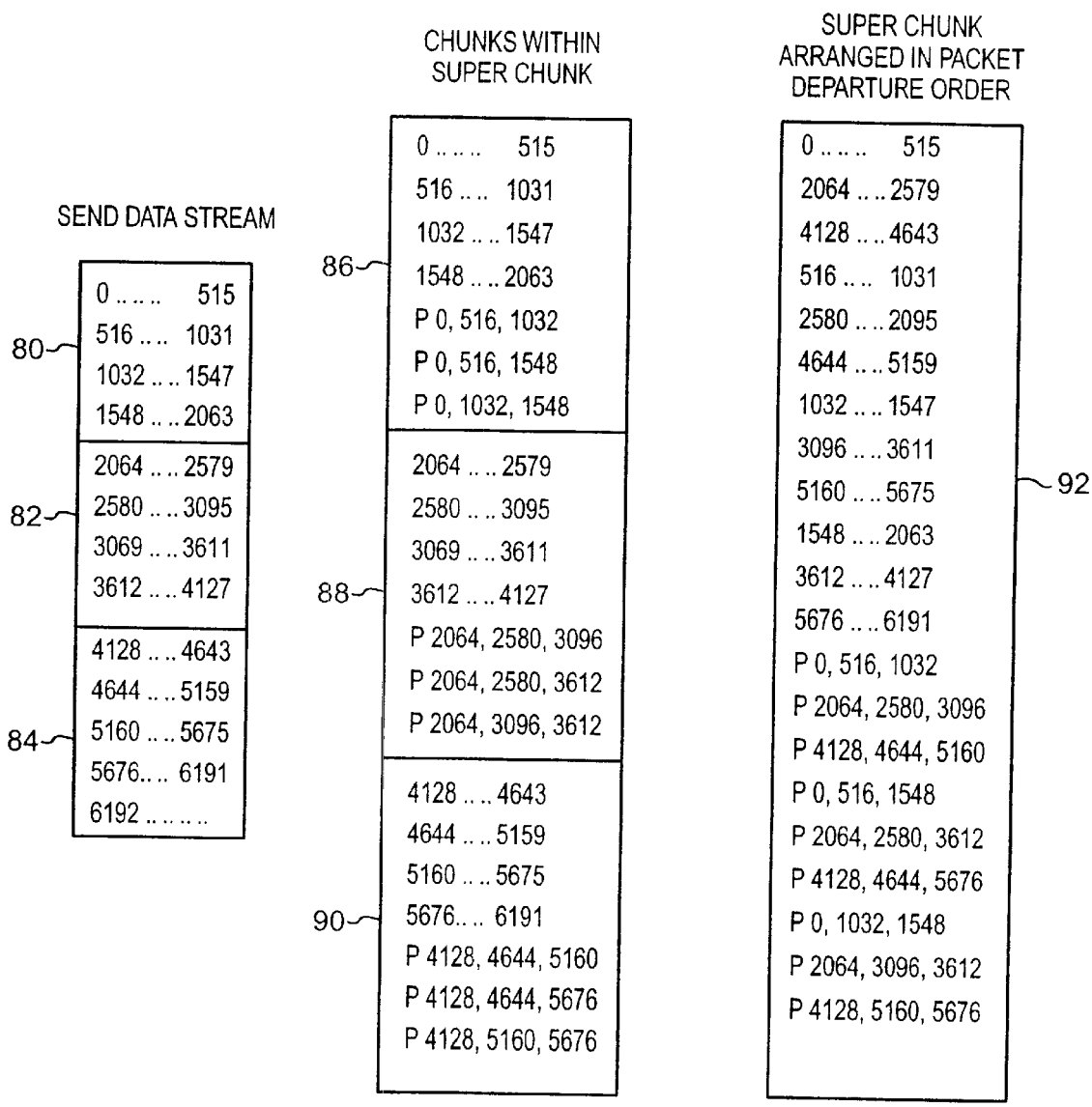
FIG. 3 discloses the payload contents of the packets, chunks and superchunks.

Disclosed in FIG. 3 is an example of a transmission packetization and arrangement performed by the transmitter 2. The data arrangement for this Figure illustrates in particular the case where the payload portion of each packet is 516 bytes in length, and where redtype=131, ($2^N-1$) are sent to recover ($2^N-1$)-N with the N=3 parity, is selected so that each chunk contains seven packets (three of them parity), and the superchunk interleave is 3:1 so that 3 chunks make up a superchunk. The bytes within the send data stream are sequentially numbered for this example starting at zero. The send data stream is segmented into Super Information Blocks of 6,192 bytes each, with each Super Information Block being further divided into three chunk information blocks 80, 82, and 84 of 2,064 bytes each. Each chunk information block is further divided into 4 information packets of 516 bytes each. The three chunks 86, 88, and 90 are contained within the superchunk 92. The seven packets within each chunks are comprised of four information packets and three parity packets. Each packet is comprised of a header and 516 bytes of payload. For the information packets, the payload is comprised of bytes from the data stream. To aid in understanding the blocking of the data stream bytes through the process, each information packet is identified by the sequence numbers from the data stream which are contained in that packet. Each parity packet is identified by the 3 sequence numbers of the first bytes contained in the information packets from which that parity packet was formed. Thus the payload of the parity packet identified "P 2064, 2580, 3612" was formed from the exclusive OR of the payloads of the 3 information packets 2064–2579, 2580–3095, and 3612–4127. The 21 packets of the superchunk 92 are transmitted in an interleaved fashion over the network.

Figure 4A:
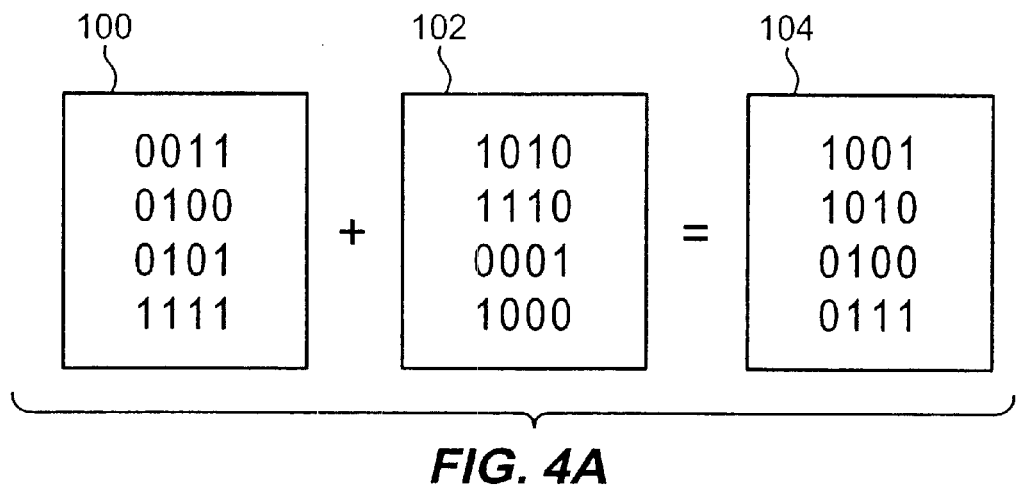
FIGS. 4a and b disclose an example of the exclusive OR process in the creation of parity packets and in the recovery of information packets.
Figure 4B:
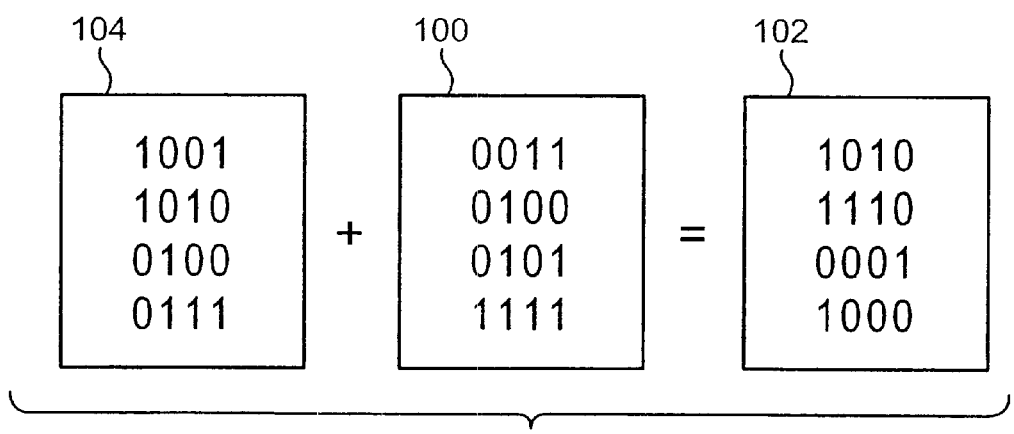

As was mentioned above, the parity bytes which are included in the chunks with the data bytes are generated by performing particular mathematical functions on all or a portion of the data bytes included in the information packets. These parity bytes are used at the receiving end of the transmission to reconstruct lost or damaged information packets. The diagrams in FIGS. 4a and 4b are examples of the creation of parity packets, and the use of parity packets to recover lost information packets.

Described below is the exclusive or (XOR) calculation method for recovering lost or damaged information packets. In the method illustrated in FIGS. 4a and 4b, N+1 packets are transmitted in order to receive N packets (N+1:N parity). In other words, one parity packet is generated within each chunk in order to recover one lost or damaged information packet at the receiver. Blocks 100 and 102 shown in FIG. 4a are a hypothetical configuration of bits which would be included in the data portion 70 of each information packet which is sent. In this example, the data portion of each transmission packet is a four-by-four 16-bit array. In this embodiment, three transmission packets are included in each chunk in order to assure the receiving of two information packets. In order to create parity packet 104, an XOR operation is performed between corresponding bits in transmission packets 100 and 102. An XOR operation is merely one way in which this parity packet can be created. One skilled in the art would realize that a variety of mathematical functions could be used to generate a parity packet which would serve the same purpose. After the parity packet is created it is combined with the chunk, which is in turn transmitted over the data network.

Figure 14:
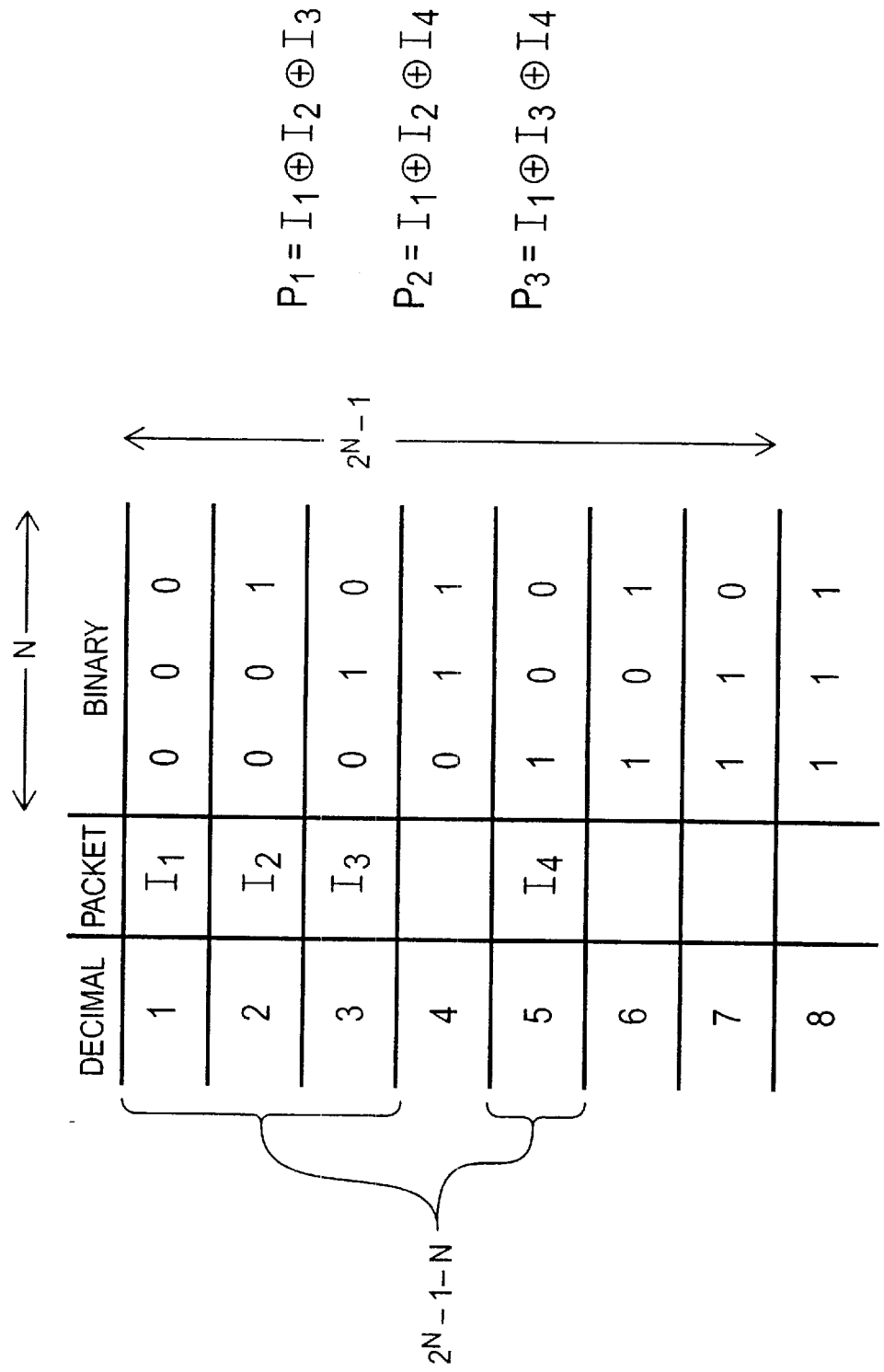
FIG. 14 is a table showing possible contribution patterns for generating parity packets for a particular parity type.

For N+1:N parity, the chunking process simply involves dividing the data stream at each N packets and using an XOR or other operation as described above to generate a parity packet for the chunk. A slightly more complicated chunking process is required for $2^N-1:(2^N-1)$-N parity. In particular, proper parity packet generation and lost packet recovery can be assured by establishing parity packets according to the following rules: 1) each information packet participates in establishing at least two parity packets; and 2) each of the parity packets is generated through the use of a unique combination of information packet participation. The possible combinations for satisfying these conditions are illustrated in FIG. 14 for the case of $2^N-1:(2^N-1)$-N parity for N=3. That is, FIG. 14 shows combinations for sending chunks of 7 packets (4 information packets+3 parity packets) to receive 4 packets. In the figure, the rows indicate a particular packet, and columns indicate different patterns of participation.

The rows of FIG. 14 are generated by base 2 counting from 000 to 111. The rows are examined for those which have only one "0." Those rows are associated sequentially with parity packets. The rows are then examined for those which have 2 or more "0"'s. Rows with two or more "0"'s are associated sequentially with information packets. Each parity packet is generated from those information packets which have "0" in the same column as the parity packet's "0." For purpose of reference, the rows are numbered (in base 10) 1–8.

It will be observed that there are $2^N$ rows, one of which has no "0"'s. Thus, there are $2^N-1$ rows with at least one "0". There are N rows with only one "0", and there are $2^N-1$-N rows with two or more "0"'s.

Where ⊕ indicates an XOR operation:

P1 has a "0" in the left most column, as do $I_1$, $I_2$, and $I_3$, giving $P1=I_1 \oplus I_2 \oplus I_3$ P2 has a "0" in the central column, as do $I_1$, $I_2$, and $I_4$, giving $P2=I_1 \oplus I_2 \oplus I_4$ P3 has a "0" in the right most column, as do $I_1$, $I_3$, and $I_4$, giving $P3=I_1 \oplus I_3 \oplus I_4$ For all values of N, enumerating by base 2 counting of N columns, makes $2^N$ unique rows, and results in one row with no zeros, N rows with one zero, and $2^N-1-N$ rows with a unique pattern of 2 or more zeros.

It may also be observed that each column has half zeros and half ones, or $2^{(N-1)}$ zeros. Of those $2^{(N-1)}$ rows with zeros in them one is assigned as a parity which is then derived from the other $2^{(N-1)}-1$ which are assigned as information packets.

When the transmission packets are received, the chunks are checked as to whether any of the transmission packets have been damaged or destroyed. As in TCP, packet loss is detected if expected packets don't arrive in the allowed time. In one implementation, the time of arrival from the first packet in a chunk to the last packet in the chunk is chunk build time, and the allowed time for receipt of all packets within a chunk is 1.2 times the averaged chunk build time. The allowed time before declaring a packet lost is initially set to 1 second with a lower bound to 0.25 seconds and an upper bound to 10 seconds. If an information packet has been lost or damaged the parity packet is used in conjunction with the remaining information packets to restore it. In the example of FIG. 4b, the 102 information packet has been lost. In order to restore this information packet, an XOR operation is performed between the parity packet 104 and the remaining information 100. Through this operation, all the bits in information packet 102 are restored. As was mentioned previously, the N+1:N process can only be used to recover a single transmission packet at the receiver. Based on the type of problems which may be encountered while transmitting data, it may be desirable to provide methods in which multiple packets can be restored.

The types of problems in a packet switched network may be characterized by the combination of a packet loss rate (a long term count of packets lost divided by the long term count of packets transmitted) and a packet burst loss rate. A packet loss rate of 1 in 30 doesn't tell us whether the losses are evenly spread, randomly spread, or tend to occur in clumps. The superchunk 2:1 interleave disclosed in FIG. 5 illustrates how the low overhead N+1:N parity approach can recover from lost packets occurring in pairs. Chunk 106 consists of 11 information packets and 1 parity packet, Chunk 108 also consists of 11 information packets and one parity packet. The packets from the two chunks are arranged in Superchunk 110 to be transmitted on the network in interleaved order. Any pair of adjacent packets may be lost in transmission but recovered by the receiver. The preferred embodiment has the same redtype for all of the chunks in the same superchunk. This simplifies the interleaving (since all of the chunks in the same superchunk have the same number of packets and the interleaving comes out even) and it simplifies the decision of when to change redtype and interleave to adjust redundancy.

Figure 12:
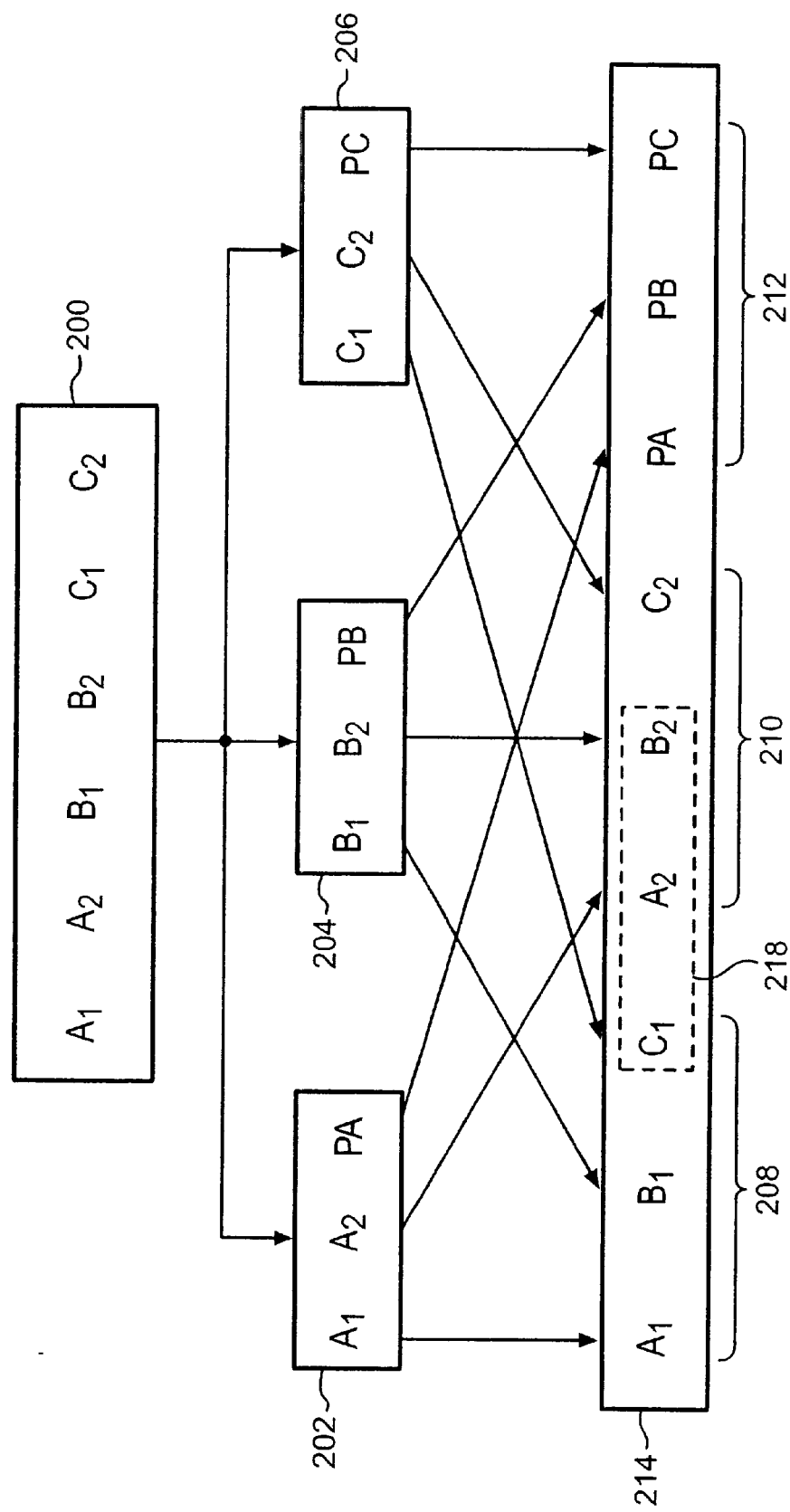
FIG. 12 illustrates a process for interleaving chunks in a superchunk.

Those skilled in the art will recognize it is possible to perform interleaving in a number of ways and recover any defined number of packets lost in a burst so long as the number of chunks being interleaved exceeds the burst length to be recovered and the overall packet loss rate is acceptably low. For the interleaving to come out even on superchunk boundaries is a convenience. FIG. 12 illustrates how inter leaving three chunks in a superchunk allows for recovery of a burst of three lost packets using, in the illustrated case, N+1:N parity where N=2. Block 200 shows an input packetized data stream. The packets are divided into three chunks 202, 204 and 206, which are then interleaved to form three interleaved chunks 208, 210, and 212 of superchunk 214. Chunk 202 also includes a parity packet PA derived from packets $A_1$ and $A_2$. Chunk 204 also includes a parity packet PB derived from packets $B_1$ and $B_2$. Chunk 206 also includes a parity packet PC derived from packets $C_1$ and $C_2$. The phantom box 218 in block 214 indicates a burst of three lost packets, $C_1$, $A_2$ and $B_2$. These packets could not be regenerated using N+1:N redundancy without interleaving as more than one packet is missing. However, after interleaving, each interleaved chunk includes only one lost packet which can be regenerated using the corresponding parity packet. It will thus be appreciated that, by selecting the superchunk size so that the number of chunks per superchunk is at least as great as the anticipated maximum number of lost packets in a burst, burst events can effectively addressed.

Disclosed in FIGS. 6a, b, c, and d is the calculation of the contents of the payload portion for the three parity packets within a 7,4 Chunk. FIG. 6a discloses a data stream of 15 bytes which is to be transmitted over the network. This stream is divided into 4 data payloads of 4 bytes each in Information packets 0, 1, 2, and 3 (one byte of padding is added to Information packet 3 to make the payloads match in length). FIG. 6b discloses the binary content of each of the information packets created from the data stream. As was described above, an XOR is performed on the information packets in order to generate the parity packets. As shown in FIG. 6c, the payload portion of parity packet 4 is calculated by performing an XOR on the payload portion of information packets 0, 1, and 2. Similarly, in FIG. 6c the payload portion of parity packet 5 is calculated with the XOR of the payload portions of information packets 0, 1, and 3. Finally, the payload portion of parity packet 6 is derived from the payload portions of information packets 0, 2, and 3, as shown in FIG. 6e.

When the information packets are transmitted over the network and received at the data receiver, the possibility exists that some of the transmission packets may be lost (or damaged and lost by discarding). If some of the packets have been lost they may be constructed through the use of the packets which were received intact. Each information packet that was transmitted can be constructed by performing an XOR on a particular combination of the transmission packets. Shown in FIGS. 7a, b, c, and d are instructions for the re-writing of the parity generation described in FIGS. 6c, d, and e. These instructions facilitate solving for payloads from lost packets. Not all possible re-writings of the parity generation are shown, the subset chosen provides for error correction which is not inferior to other subsets which could have been chosen. The table in FIG. 7a discloses a combination of received transmission packets sufficient to recreate the payload of packet 0. Specifically, the payload of information packet 0 may be recovered first if information packets 1 and 2 and parity packet 4 had been correctly received, second if information packets 1 and 3 and parity packet 5 had been correctly received, third if information packets 2 and 3 and parity packet 6 had been correctly received, and fourth if parity packets 4,5 and 6 had been correctly received. The table in FIG. 7b discloses a combination of received transmission packets sufficient to recreate the payload of packet 1. Specifically, the payload of information packet 1 may be recovered first if information packets 0 and 2 and parity packet 4 had been correctly received, and second if information packets 0 and 3 and parity packet 5 had been correctly received. The table in FIG. 7c discloses a combination of received transmission packets sufficient to recreate the payload of information packet 2. Specifically, the payload of information packet 2 may be recovered first if information packets 0 and 1 and parity packet 4 had been correctly received, and second if information packets 0 and 3 and parity packet 6 had been correctly received. The table in FIG. 7d discloses a combination of received transmission packets sufficient to recreate the payload of information packet 3. Specifically the payload of information packet 3 may be recovered first if information packets 0 and 1 and parity packet 5 had been correctly received, and second if information packets 0 and 2 and parity packet 6 had been correctly received. The table in FIG. 7e shows a sufficient set of the parity relationships represented by the generation equations of FIGS. 6a, b, and c combined with the solving equations in FIGS. 7a, b, c, and d in a more convenient table called "parity truths". There is one "parity truths" table for each redtype. One implementation has two columns in the parity truth table, the first parity entry in each parity truths table being 32 bits in length. The bits are numbered 0 through 31, with the least significant bit being numbered 0. Binary "1"'s are placed in the bit position corresponding to that packet number's participation in the equation. The table in FIG. 7e also shows the same information in hexadecimal notation.

Figure 8A:
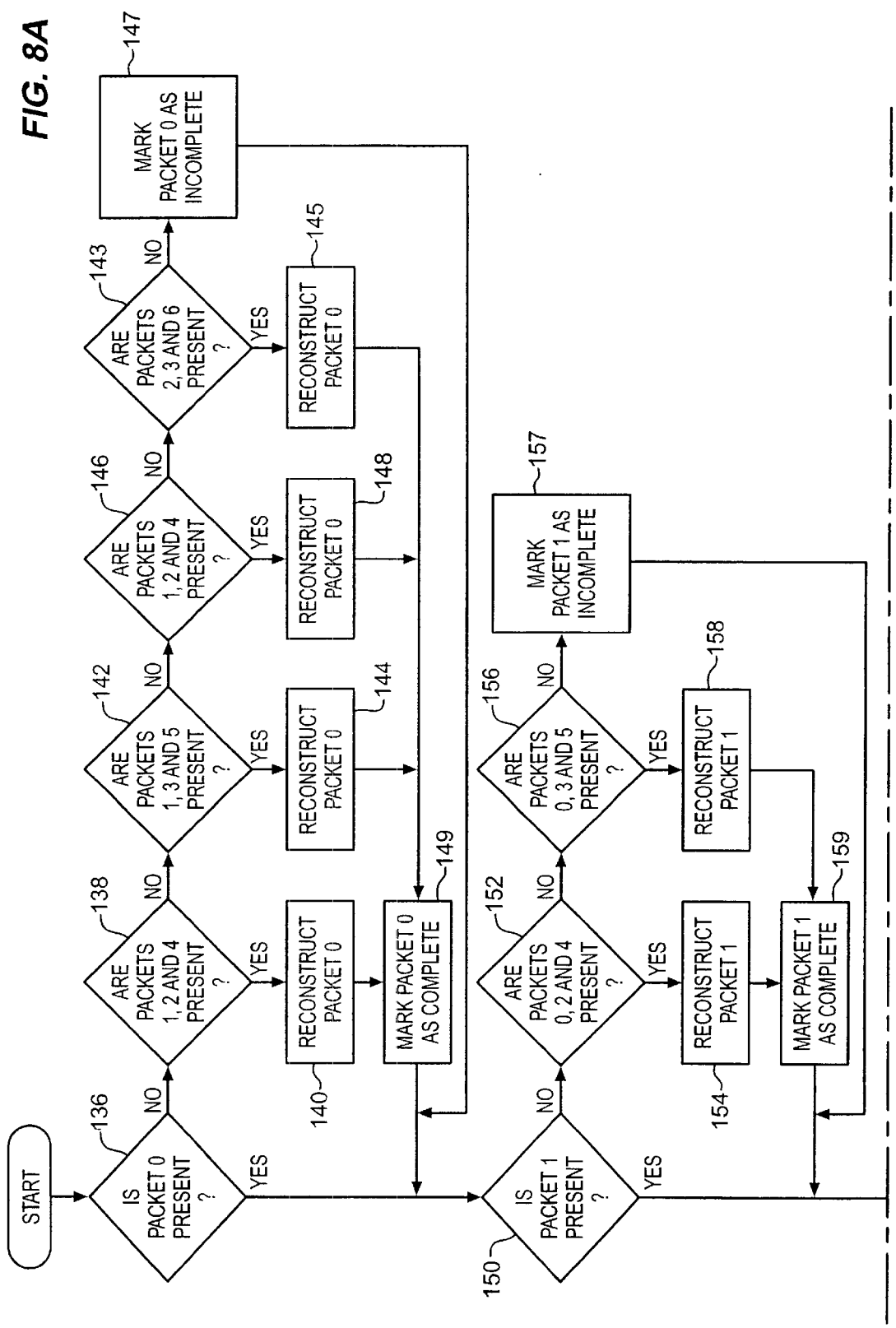
FIGS. 8a and b are flow charts describing the reconstruction of lost packets for a 7,4 chunk.
Figure 8B:
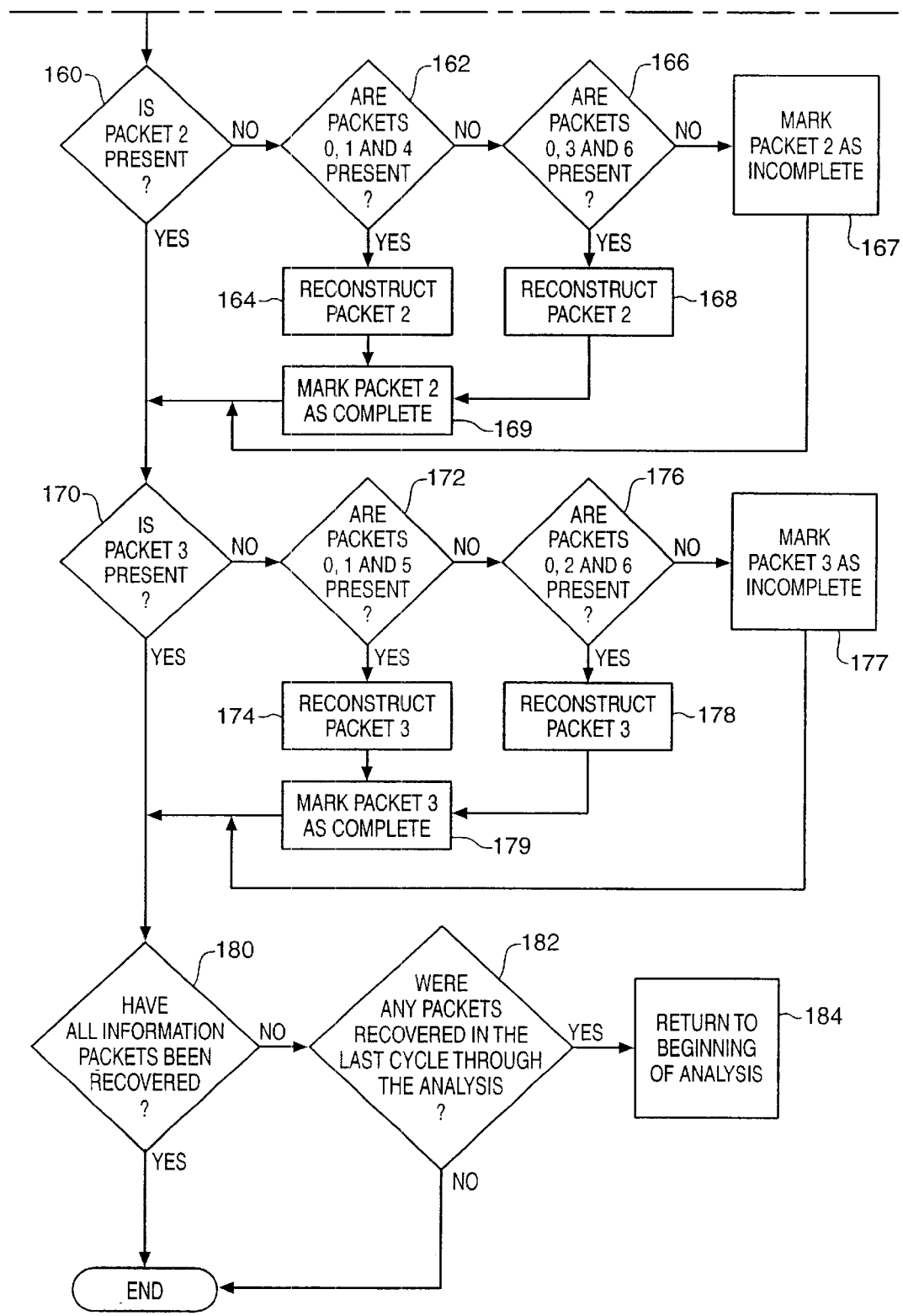

FIG. 8 is a flowchart of an algorithm which implements recovery of lost information packets for the case of redtype 131. The flowchart is derived from the parity truths in FIG. 7. In one implementation there is a separate software module for each redtype which incorporates the information for recovery which is particular to that redtype. To begin the analysis, a query is made at step 136 as to whether packet 0 is present. If packet 0 is present, the analysis continues at step 150. If packet 0 is not present, an attempt is then made to reconstruct the missing packet as was described above. The first step in doing this reconstruction is to determine whether the necessary packets survived transmission over the data network. To begin this determination, a query is made at step 138 as to whether packets 1, 2 and 4 are present. These packets are one of the sets which need to be all present in order to reconstruct packet 0. If any of the packets is missing, a query is made at step 142 as to whether packets 1, 3 and 5 are present. If any of these packets in this set are not present, a further query is made at step 146 as to whether packets 2, 3 and 6 are present. If any of these packets in this set are not present, a further query is made at step 143 as to whether packets 4, 5, and 6 are present. If any of the packets in this set are missing, packet 0 is marked as incomplete at step 147. If any fill set of these packets is present, then packet 0 is reconstructed at either step 140, 144, 148, or 145. Once this reconstruction is complete, packet 0 is marked as complete at step 149. After packet 0 has been marked as complete or incomplete, the analysis continues at 150.

At step 150, a query is made as to whether packet 1 is present. If packet 1 is present, the analysis continues at step 160. If it is not present, the analysis begins to determine whether the missing packet can be reconstructed. A query is made at step 152 as to whether packets 0, 2, or 4 are all present. If they are not all present, a further query is made at step 156 as to whether packets 0, 3 and 5 are all present. If any of these packets are missing, at step 157, packet 1 is marked as incomplete. If either sets of packets had been fully present, packet 1 is reconstructed at step 154 or 158, and then marked complete at step 159. After packet 1 is marked as either complete or incomplete, the analysis moves onto packet 2.

At step 160, a query is made as to whether packet 2 is present. If packet 2 is present, the analysis continues at step 170. If this packet is not present, a further query is made as to whether packet 0, 1, and 4 are present at step 162. If they are not, a query is made at step 166 as to whether packet 0, 3, and 6 are present. If none of the packets are present, packet 2 is marked as incomplete at step 167. If either sets of packets were present, the packet 2 is reconstructed at either step 164 or 168. Packet 2 is then marked as complete at step 169. The analysis then moves on to packet 3.

At step 170 a query is made as to whether packet 3 is present. If packet 3 is not present, the analysis continues at step 180. If this packet is not present, a further query is made at step 172 as to whether packets 0, 1 and 5 are all present. If they are not all present, a query is made at step 176 as to whether packets 0, 2 and 6 are all present. If any of these packets is missing, packet 3 is marked as incomplete at step 177. If either sets of packets had been fully present, packet 3 is reconstructed at step 174 or 178. Packet 3 is then marked as complete at step 179.

After the analysis is complete for all the information packets originally transmitted, a query is made at step 180 as to whether all the information packets have been recovered. If they all have been recovered, the analysis ends. If all the information packets have not been all recovered, a query is made at step 182 as to whether any of the information packets were recovered during the previous analysis. If no new information packets were recovered, the process ends. If a new information packet was recovered, the analysis begins again at step 136. This loop through the analysis will continue until either all the information packets are recovered, or is determined that no more information packets are recoverable.

A specific example of the analysis described in FIGS. 8a and b is shown in FIGS. 9a, b and c. The example to be described is a chunk of redtype 131 which has been transmitted and received, and it is detected that packets 0, 2, and 6 were lost. With the above packets missing, it is known that packets 5, 4, 3, and 1 were received. The binary content of payload for these packets is shown in FIG. 9a. Using this information in the flowchart in FIG. 8, at step 136 it is detected that packet 0 is not present. The query is made at step 138 as to whether packets 1,2 and 4 are all present. It is known that packet 2 is missing. The analysis moves on to step 142 where the query is made as to whether packets 1, 3, and 5 are present. Since all these packets are present, at step 144, a XOR will be performed between the three packets to reconstruct packet 0. The results of the reconstruction is shown in FIG. 9b.

With packet 0 reconstructed, the flow chart moves on to step 150 where the query is made as to whether packet 1 is present. Because this packet is present, the analysis moves on to step 160 and the query is made as to whether packet 2 is present. Because packet 2 is not present, the query is made at 162 as to whether packets 0, 1 and 4 are present. It is detected that these packets are present and packet 2 is reconstructed at step 164. The payload portion of packets 0, 1 and 4 as well as the recovered packet 2 is shown in FIG. 9c.

After packet 2 has been marked complete the analysis moves on to step 170 where the query is made as to whether packet 3 is present. Since packet 3 is present, query is made at step 180 as to whether all the information packets have been recovered. In this case they have, so the analysis ends.

If all the packets had not been recovered on the first pass through the analysis, and at least one of the lost packets had been recovered, the process starts again at step 136. The analysis is done again with all the packets which were originally received as well as any of the packets which were recovered.

When the information packets are transmitted over the data network, more than one of the information packets can be lost. The tables shown in FIGS. 10 and 11 document the recovery rate of lost information packets in a 7, 4 chunk redtype of 131. FIG. 10 shows specifically the case where two packets are lost during the transmission of a 7,4 chunk. In this case it should be noted that there is 100% recovery of all transmitted information packets. It should be noted that no recovery of parity packets 4, 5 and 6 is attempted because the process is only interested in recovering information packets, and we have found that recovering parity packets is not required.

Shown in FIG. 11 is a table of cases for three lost packets in a 7, 4 chunk of redtype 131. In this case, data was recovered in 28 out of the 35 possible ways three packets can be lost. As with the previous examples, no reconstruction was necessary in the case of parity packets. Similarly in a 15,11 chunk of redtype 132 (N=4) recovery is successful in over 90 percent of the ways in which three packets can be lost and over 60 percent of the ways in which 4 packets can be lost. Also, in a 31,26 chunk of redtype 133 (N=5) recovery is successful in over 95 percent of the ways in which three packets can be lost, over 80 percent of the ways in which four packets can be lost, and over 45 percent of the ways in which five packets can be lost.

Figure 13:
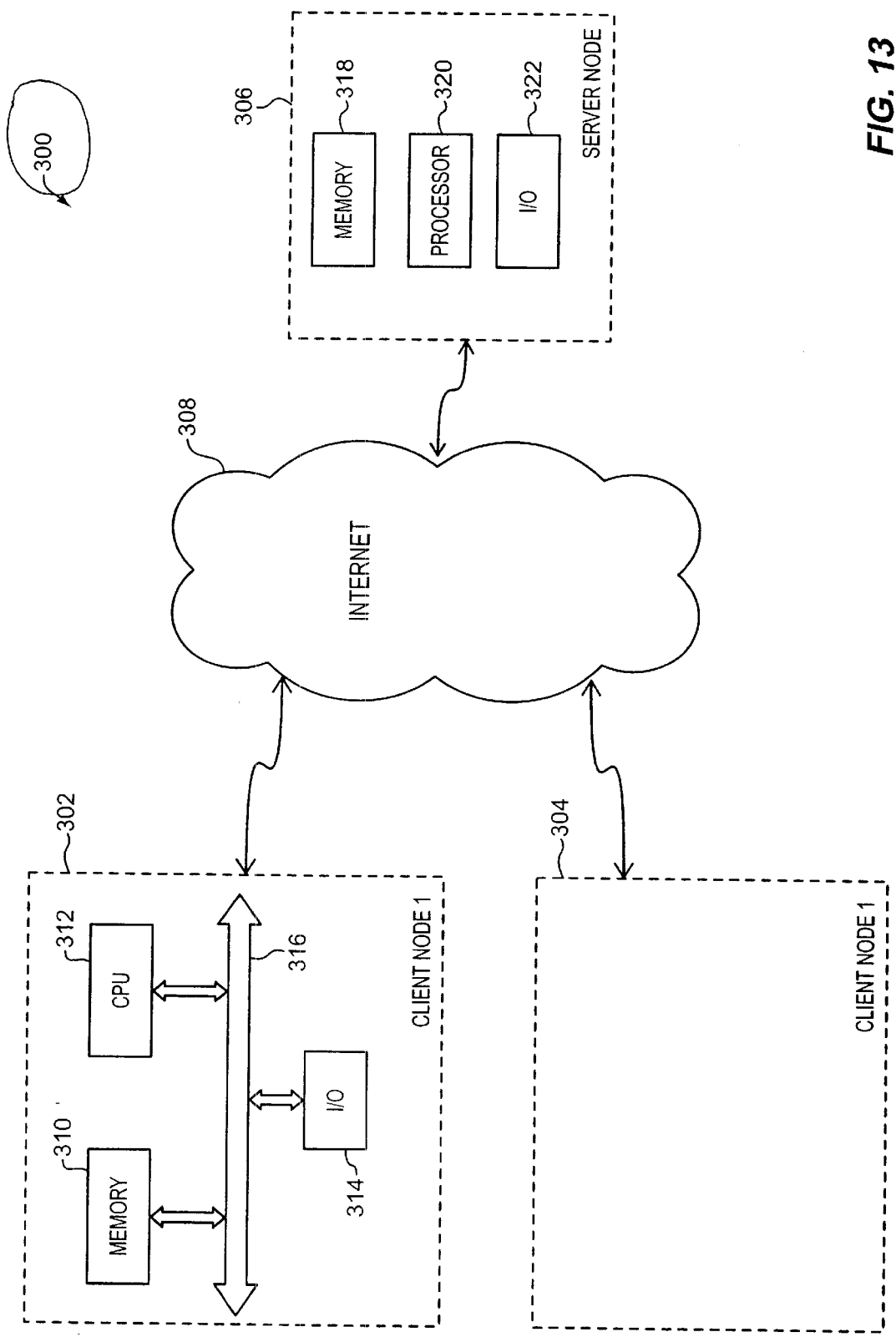
FIG. 13 illustrates a network in connection with which the present invention may be implemented.

FIG. 13 illustrates a network 300 in connection with which the present invention may be implemented. For purposes of illustration, the network 300 is shown as including two client nodes 302 and 304 and as server node 306 that communicate across the internet 308. It will be appreciated that any number of nodes may be supported in accordance with the present invention and that various public or private network structures may be used in addition to or in place of the internet 308. In addition, only one of the client nodes 302 is illustrated and described in detail, it being understood that the other client node 304 is similar in relevant respects. Moreover, it will be understood that, while the nodes are designated as being "client nodes" or a "server node" for purposes of the present illustration, a particular node utilized in connection with the present invention may be both a client and a server.

The client node 302, which may be a PC or other computer, generally includes memory 310 (e.g., computer memory, cache memory, buffer storage, etc.), a CPU 312 and input/output devices 314 (e.g., keyboard, mouse, fax modem, etc.) that communicate via a data bus 16. Similarly, the server node 306 includes memory 318, processor 320 and input/output devices for receiving operator inputs and supporting multiple simultaneous client connections. The server node 306 may be, for example, a server for a network browser service. In order to implement the teachings of the present invention, logic for implementing the transmit and receive parity packet functions described above may be stored in server memory 318 and run on processor 320. For example, such logic may be provided on a CD or other storage unit that can be read by the server processor 320. In addition, transmission packets used for communication between the server node 306 and one of the client nodes 302 and 304 in accordance with the present invention are at least transiently stored in server memory 318.

As noted above, transmit logic for generating parity packets, forming superchunks, transmitting a transmission packet stream, etc. and/or receive logic for identifying lost packets, using parity packets to regenerate lost packets, etc. may be resident on the client nodes 302 and 304 to permit parity packet based packet recovery without retransmission according to the present invention. Such logic may be installed at the client nodes 302 and 304 from a disk or other storage medium. Alternatively, such logic or parts thereof may be downloaded from the service node 306 to the client nodes 302 and 304 via the internet 308 or installed on the client node computers as part of an OEM software package. For example, such logic may be included as part of tools delivered to clients by a browser service or a network audio or video service. The logic is stored in client memory 310 and runs on CPU 312. In addition, transmission packets including parity packets for use in accordance with the present invention for communications between clients nodes 302 and 304 or between a client node 302 and 304 and server node 306 are at least transiently stored in client memory 310. It will thus be appreciated that server memory 318 and client memory 310 are configured to store transmission packets (including parity packets) and to store transmit and/or receive logic. Such configuration is accomplished by loading/downloading the logic (e.g., addressing the associated files to the client and transmitting the files from the server node) or by transmitting or receiving a transmission packet stream including parity packets in accordance with the present invention.

The foregoing description of the present invention has been presented for purposes of illustration and description. Furthermore, the description is not intended to limit the invention to the form disclosed herein. Consequently, variations and modifications commensurate with the above teachings, and the skill or knowledge of the relevant art, are within the scope of the present invention. The embodiments described hereinabove are further intended to explain best modes known for practicing the invention and to enable others skilled in the art to utilize the invention in such, or other, embodiments and with various modifications required by the particular applications or uses of the present invention. It is intended that the appended claims be construed to include alternative embodiments to the extent permitted by the prior art.

What is claimed is:

1. A method for transmitting a data stream over a network between a first host and a second host, said method comprising the steps of:

dividing, at said first host, said data stream into at least one Super Information Block;

dividing, at said first host, said Super Information Block into M Chunk Information Blocks where M is at least one and wherein each Chunk Information Block includes at least one information payload;

selectively generating, at said first host, zero or more parity payloads corresponding to each Chunk Information Block and derived from a subset of said information payload within said Chunk Information Block wherein said zero or more parity payloads are selectively generated in accordance with history of prior exchanges between said first host and said second host;

transmitting, from said first host to said second host, said information payload along with any corresponding said zero or more parity payloads;

receiving, in said second host, said at least one information payload and any corresponding said parity payload;

detecting, in said second host, any problems in receipt of said information payload;

determining, in said second host, whether any of said zero or more parity payloads have been received;

recovering, in said second host, lost payloads of said at least one information payload using any corresponding said parity payload in response to the step of detecting and in response to the determination that said at least one parity payload has been received;

sending an acknowledgment from said second host to said first host indicating the progress of the data stream's transmission;

receiving said acknowledgment in said first host;

retransmitting, from said first host to said second host, at least one identified payload in response to receipt of said acknowledgement indicating that retransmission is required;

retransmitting, from said first host to said second host, said at least one identified payload along with any corresponding said parity payload in response to failure to receive said acknowledgement within an allowed time; and updating, in said first host, a history of acknowledgements received and retransmissions sent.

2. The method of claim 1 implemented as a TCP extension, further comprising the step of:

exchanging options in TCP packets having an SYN flag bit set between said first host and said second host information indicating their respective support of redundant payloads.

3. The method of claim 2 wherein the step of exchanging comprises the step of:

exchanging options in TCP packets having an SYN flag bit set between said first host and said second indicating their respective support of RFC 1323 timestamps.

4. The method of claim 2 wherein the step of exchanging comprises the step of:

exchanging options in TCP packets having an SYN flag bit set between said first host and said second indicating their respective support of RFC 1323 window scaling.

5. The method of claim 2 further including the step of:

restricting the number of said information and parity payloads sent in a given time interval so as not to exceed a specified packet count.

6. The method of claim 2 further including the step of:

restricting the number of said information and parity payloads sent in a given time interval so as not to exceed a specified bit rate.

* * * * *